(12) United States Patent
Lindsay

(10) Patent No.: US 6,271,682 B1
(45) Date of Patent: Aug. 7, 2001

(54) METHOD AND APPARATUS FOR HIGH-SPEED EDGE-PROGRAMMABLE TIMING SIGNAL GENERATOR

(75) Inventor: Brent Lindsay, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/388,053

(22) Filed: Sep. 1, 1999

(51) Int. Cl.[7] ................................................. H03K 19/00
(52) U.S. Cl. .......................... 326/93; 327/298; 708/272
(58) Field of Search .............................. 326/93, 62, 82; 327/175, 176, 298, 35; 708/272, 273

(56) References Cited

U.S. PATENT DOCUMENTS

| | | | |
|---|---|---|---|
| 3,763,364 | * 10/1973 | Deutsch et al. | 235/152 |
| 4,404,644 | * 9/1983 | Howie | 708/272 |
| 4,675,546 | * 6/1987 | Shaw | 327/176 |
| 4,881,190 | * 11/1989 | Priatko et al. | 708/272 |
| 5,227,961 | * 7/1993 | Claydon et al. | 363/17 |
| 5,550,499 | * 8/1996 | Eitrheim | 327/175 |
| 5,638,016 | * 6/1997 | Ditrheim | 327/175 |

* cited by examiner

Primary Examiner—Michael Tokar
Assistant Examiner—Daniel D. Chang
(74) Attorney, Agent, or Firm—Hugh Kress Winstead Sechrest & Minick

(57) ABSTRACT

A method and apparatus for generating a timing signal for a semiconductor device, wherein the timing of rising and falling edges in the timing signal can be very precisely controlled. In one embodiment, a serial data stream derived from data stored in a memory device is applied to the inputs of first and second programmable delay elements each adapted to introduce a delay into the serial data stream. The resulting first delayed serial data stream is applied to the SET input of a flip-flop circuit; the resulting second delayed serial data stream is applied to the RESET input of the flip-flop. The output of the flip-flop constitutes the generated timing signal. The rising and falling edges of the timing signal are controlled through manipulation of the lengths of the delays introduced by the first and second delay elements into the serial data stream. Manipulation of the delay times is accomplished through adjustment of analog programming voltages applied to the respective delay elements. In another embodiment of the invention, a separate serial data stream is applied to each delay element.

7 Claims, 4 Drawing Sheets

METHOD AND APPARATUS FOR HIGH-SPEED EDGE-PROGRAMMABLE TIMING SIGNAL GENERATOR

FIELD OF THE INVENTION

The present invention relates generally to semiconductor devices, and more particularly to a method and apparatus for generating electronic signals for controlling operation of semiconductor devices.

BACKGROUND OF THE INVENTION

Those of ordinary skill in the field of semiconductor devices will be familiar with many different types of such devices, including, for example, microprocessors and various types of memory devices, such as dynamic random-access memory devices ("DRAMs"), synchronous DRAMs ("SDRAMS"), static random-access memory devices ("SRAMS"), and the like, capable of storing millions of bits of digital information.

In many cases, semiconductor devices are required to be operated at very high speeds. For example, the clock signal controlling operation of a microprocessor may be an oscillating square wave having a frequency of several hundred megahertz or more, such that the microprocessor is capable of executing hundreds of thousands or even millions of machine instructions each second. Likewise, semiconductor memory devices, whether synchronous or asynchronous, are preferably capable of being accessed (i.e., having data read from or written to) millions of times per second.

A typical semiconductor device operates by being responsive to a plurality of digital control signals applied to its control signal input terminals (often referred to as "pins"). (As used herein, the term "control signal" is intended to refer to essentially any electrical signal applied to a semiconductor device during operation thereof, including without limitation, control signals, clock signals, test signals, address and data signals and the like.) For example, a DRAM is responsive to a row address strobe ("RAS") input control signal, a column address strobe ("CAS") input control signal, a read/write ("R/W") signal, and a plurality of address signals to access a particular memory location. To access a memory device, either to read data from a desired location in the memory or to write data to a desired location, external control circuitry manipulates the logic states of the various applied control signals. A RAS signal conditions a memory device to receive a row address applied to its address pins, a CAS signal conditions a memory device to receive a column address applied to its address pins, and the R/W signal conditions the device to perform either a read operation to, or a write operation from, the memory location specified by the received row and column address signals.

A semiconductor device may be responsive to the logic states of control signals, i.e., a logic "1" represented by a control signal having a "high" voltage of 3.3 to 5 volts, or a logic "0" represented by the control signal having a "low" voltage of zero volts. Alternatively, it is not uncommon for a semiconductor device to be responsive to "edges" of certain control signals, i.e., a rising edge transition from a logic "0" state to a logic "1" state, or a falling edge transition from a logic "1" state to a logic "0" state. As a simplified example, a transition from a logic "1" to a logic "0" in the applied RAS control signal, assuming the logic states of certain other applied control signals are appropriate, may define the initiation of a row address input interval during which time the memory device uses the address bits applied to its address pins to locate the row of memory to be accessed.

Those of ordinary skill in the art will appreciate that when semiconductor devices are to be operated at very fast rates, the timing of the various applied control signals must be very precise. Certain control signal timing tolerances, typically specified by semiconductor device manufacturers, must be observed in order to ensure proper device operation. Such tolerance parameters are typically defined for each signal relative to one or more other control signals applied to the device. As a generic example, it may be the case that an edge must occur in one signal within a predetermined period of time following the occurrence of an edge in some other applied signal. As another generic example, it may be specified that one particular control signal must be in a given state (high or low) for at least some predetermined period of time prior to the occurrence of an edge in some other signal. Often, these predetermined periods of time are quite small indeed, on the order of one to three nanoseconds, or in some cases even less.

Precision in control signal timing is important not only for the purposes of normal operation of semiconductor devices, but also—perhaps even more so—for the purposes of semiconductor device testing. Precisely controlling and varying control signal timing is important from the standpoint not only of ensuring that a device will operate properly if specified timing parameters are observed, but also of enabling a tester to determine what timing parameters should be specified for a device under test, or to determine to what extent a particular device might be tolerant to control signal timing variations beyond those specified for the device.

Various types of automated test equipment are known and available for conducting operational tests on individual semiconductor devices. Typically, such equipment is adapted to automatically run a semiconductor device through a sequence of test regimens during which one or more control signal timing parameters may be varied through a range of values. This enables the testing system to determine whether the device under test is tolerant to such variations within the ranges reflected in the device's specifications, and further to determine whether the device is tolerant to an even wider range of variations, such that different specifications may be provided for the device under test.

Those of ordinary skill in the art will appreciate that the implementation of circuits for generating the high-speed, precision control signals necessary either to operate or to test a semiconductor device can constitute a non-trivial engineering challenge. Implementing control signal generating circuitry for semiconductor device testing equipment is particularly challenging in view of the fact that it involves generating precisely-timed signals that themselves are capable of being variably time-adjusted with an even greater degree of precision.

One example of a control signal generator suitable for the purposes of semiconductor device testing is proposed in U.S. Pat. No. 4,675,546 to Shaw, entitled "Edge Programmable Timing Signal Generator." The '546 patent appears to disclose an edge-programmable timing signal generator which makes use of predetermined and variable-length delay elements to which an input timing signal is applied. Varying the delay interval of one of the variable-length delay elements enables precision adjustment of the rising edge of the resultant output signal, while varying the delay interval of another of the delay elements enables precision adjustment of the falling edge of the output signal.

As noted in the '546 patent, there is a recognized desire for programmable timing signal generators which are simple in their design, and hence inexpensive, but nonetheless capable of outputting very precisely variable control signals.

SUMMARY OF THE INVENTION

In view of the foregoing and other considerations, the present invention relates to a method and apparatus for edge-programmable timing signal generation in which the timing of rising and falling edges in the timing signal can be very precisely controlled.

In one embodiment, binary digital data coarsely defining the desired timing of rising and falling edges in the timing signal to be generated is stored in a conventional semiconductor memory device. The memory device is accessed to obtain a plurality of data bits therefrom in parallel. The accessed data is applied to the input of a serializer to produce a serial data stream. The serial data stream is applied to the inputs of first and second programmable delay elements. Each delay element is adapted to introduce a delay into the serial data stream. The resulting first delayed serial data stream is applied to the SET input of a flip-flop circuit; the resulting second delayed serial data stream is applied to the RESET input of the flip-flop. The output of the flip-flop constitutes the generated timing signal. The rising and falling edges of the timing signal are controlled through manipulation of the lengths of the delays introduced by the first and second delay elements into the serial data stream. Manipulation of the delay times is accomplished through adjustment of analog programming voltages applied to the respective delay elements.

In another embodiment of the invention, separate serial data streams are applied to the respective delay elements. Each time the memory device is accessed, a first sub-set (e.g., half) of the accessed data bits is applied to a first serializer to derive a first serial data stream and a second sub-set of the accessed data bits is applied to a second serializer to derive a second serial data stream.

BRIEF DESCRIPTION OF THE DRAWINGS

The foregoing and other features and aspects of the subject invention will be best understood with reference to a detailed description of a specific embodiment of the invention, which follows, when read in conjunction with the accompanying drawings, in which.

DETAILED DESCRIPTION OF SPECIFIC EMBODIMENTS OF THE INVENTION

In the disclosure that follows, in the interest of clarity, not all features of actual implementations are described. It will of course be appreciated that in the development of any such actual implementation, as in any such project, numerous engineering and programming decisions must be made to achieve the developers' specific goals and subgoals (e.g., compliance with system- and business-related constraints), which will vary from one implementation to another. Moreover, attention will necessarily be paid to proper engineering and programming practices for the environment in question. It will be appreciated that such a development effort might be complex and time-consuming, but would nevertheless be a routine undertaking for those of ordinary skill in the field of semiconductor device technology.

Figure 1:
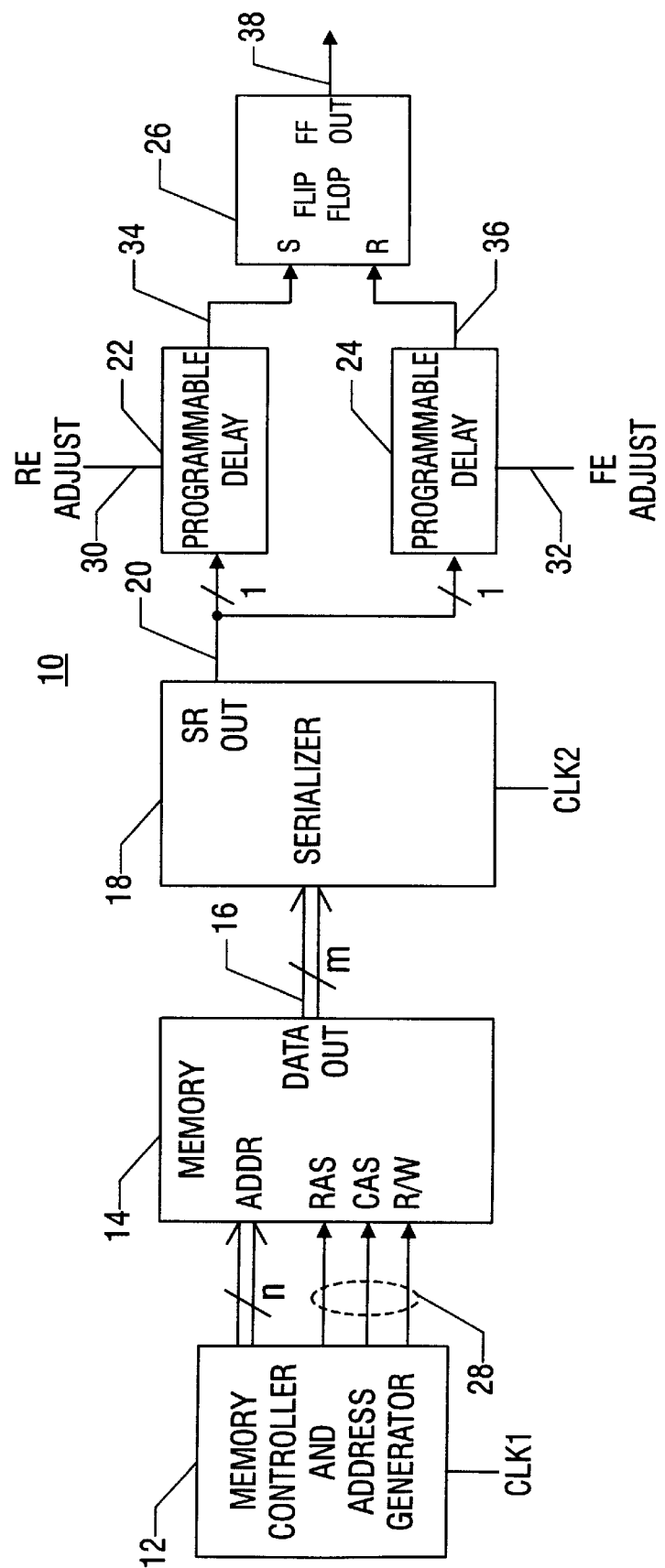
FIG. 1 is a block diagram of an edge-programmable timing signal generator in accordance with one embodiment of the invention.

Referring to FIG. 1, there is shown a simplified block diagram of an edge-programmable timing signal generator 10 in accordance with one embodiment of the invention. As shown in FIG. 1, timing signal generator 10 comprises a memory controller and address generator 12 for controlling access to specified addresses in a semiconductor memory device 14. The contents of address memory locations are supplied on parallel data output lines 16 to the input of a parallel-to-serial data converter or serializer 18. The serial output of serializer 18 is supplied on line 20 to the inputs of two programmable delay elements 22 and 24. The respective outputs of delay elements 22 and 24 are in turn applied to the set and reset inputs of a binary flip-flop 26.

Memory controller and address generator 12 is responsible for accessing specified memory locations in memory 14. In particular, as shown in FIG. 14, controller 12 applies n-bit addresses to the address (ADDR) inputs of memory 14, and further applies appropriate control signals to control input terminals of memory 14. Those of ordinary skill in the art will be familiar with the various control signals necessary to access locations in memory 14, including row and column address strobe (RAS and CAS) signals, a read/write (R/W) signal, and so on. For the sake of clarity in the Figures, the RAS, CAS, and R/W control signal lines are designated collectively with reference numeral 28. It is to be understood by those of ordinary skill in the art that additional control signals may be involved in accessing memory 14; details of those control signals are not relevant for the purposes of the present disclosure and will not be discussed further herein.

It is contemplated that controller 12 may include either a simple binary counter or a microengine adapted to generate the multi-bit addresses appearing on output line applied to address terminals of memory device 14. In one embodiment, a clock signal (CLK1) is supplied as an input to controller 12 for enabling controller 12 to supply addresses to memory 14 at a specified rate, with the RAS, CAS, R/W and possibly other control signals being asserted and deasserted in appropriate synchronization.

In the presently disclosed embodiment, memory 14 is a dynamic random access memory (DRAM) of either the synchronous or asynchronous variety. Such memory devices are characterized by being capable of operation at sufficiently fast speeds for the purposes of the present invention, as will hereinafter be described in further detail. It is to be understood, however, that memory 14 may be of some other variety (SRAM, for example) depending upon the particular application. Of course, if a synchronous type of memory device is employed, memory 14 will necessarily receive a clock signal as one of its inputs; a clock signal is not shown in FIG. 1.

Memory 14 is preferably of the type in which multiple bits of data are stored at each addressable location therein. That is, memory 14 is preferably of the "by four"(×4), "by eight"(×8) or "by sixteen"(×16) type in which four, eight, or sixteen bits, respectively, are presented on data output lines 16 each time a memory location. This characteristic of a memory device is sometimes referred to as the "width" of the part.

As previously described, each m-bit word of data presented on data output lines 16 from memory 14 is applied in parallel to the parallel input of serializer 18. In the presently preferred embodiment, serializer 18 performs a parallel-to-serial conversion on the data from memory 14, so as to present a serial data stream at its output. Those of ordinary skill in the art will recognize that the term "serial data stream" refers to a synchronous electrical signal which, at any given time has a logic low or logic high level corresponding to the binary ones and zeros in the data read from memory 14. The term "serializer" as used herein is intended to refer to any circuitry adapted to receive a plurality of bits in parallel at an input, and to present that inputted data as a serial data stream at an output. Those of ordinary skill in the art will be familiar with at least several well-known types of circuits capable of performing such a function, including without limitation, shift registers, multiplexers, or cross-point switches.

With continued reference to FIG. 1, serializer 18 preferably receives a clock signal input (CLK2) for controlling the rate of the parallel-to-serial conversion operation. Those of ordinary skill in the art having the benefit of the present disclosure will appreciate the timing relationship between the clock signal CLK1 applied to controller 12 and the clock signal applied to serializer 18. In particular, it is to be understood that the rate at which data appears on data output lines 16 (as well as the width of memory 14) will dictate the rate at which serializer 18 must perform its parallel-to-serial conversion function. Likewise, it is to be understood that the rate at which serializer performs its parallel-to-serial conversion function will dictate the serial data rate of the serial data stream from serializer 18.

The serial data output stream (SR OUT) from serializer 18 is applied to the inputs of programmable delay elements 22 and 24 Delay elements 22 and 24, sometimes referred to as vernier circuits, each function to introduce a measured and variable delay into the propagation of any signal applied to its input. In one embodiment, delay elements 22 and 24 are Edge628 Very High Speed ECL Delay Lines, commercially available from Edge Semiconductor, San Diego, Calif. Each delay element 22 and 24 has an input for receiving an analog signal which determines the length of delay introduced into the propagation of the input signal to the delay element. Specifically, as shown in FIG. 1, delay element 22 receives a rising edge adjust (RE ADJUST) signal 30 for controlling its delay interval, while delay element 24 receives falling edge adjust (FE ADJUST) signal 32 for controlling its delay interval. In the presently disclosed embodiment, delay elements 22 and 24 are capable of introducing approximately 6.6 nanoseconds of delay into the propagation of input signals, and the length of the delay is adjustable to a very high degree of precision (on the order of picoseconds) based on the analog voltage level applied to the delay inputs RE ADJUST 30 and FE ADJUST 32, respectively.

With continued reference to FIG. 1, the output 34 of programmable delay element 22 is applied to the "set" (S) input of a binary flip-flop 26, while the output 36 of programmable delay element 24 is applied to the "reset" (R) input of flip-flop 26. Those of ordinary skill in the art will appreciate that flip-flop 26 is responsive to assertion of its S input to assert its output (FF OUT) 38, and is responsive to assertion of its R input to deassert its output (FF OUT) 38. Binary flip-flop circuits suitable for the purposes of the present invention are widely known and commercially available.

Operation of programmable edge timing signal generator 10 in accordance with the presently disclosed embodiment of the invention can now be described with reference to the timing diagram shown in FIG. 2. As will be apparent from the following description, the timing of rising and falling edges of a timing signal generated by timing signal generator 10 is coarsely defined by digital data (binary ones and zeros) stored in memory device 14. The data stored in memory device 14 is accessed in a conventional way. The accessed data bits are serialized to generate a serial data stream signal that is applied to the serial inputs of programmable delay elements 22 and 24. Each delay element 22 and 24 introduces a delay into the serial data stream, thereby producing first and second delayed serial data streams. The lengths of the respective delays introduced by delay elements 22 and 24 are determined by the respective programming signals RE ADJUST (rising edge) and FE ADJUST (falling edge). The RE ADJUST and FE ADJUST signals are analog voltages adjustable in a conventional manner to achieve the desired delay interval in the corresponding delay element. The delayed serial data stream generated by delay element 22 is applied to the SET input of flip-flop 26, while the delayed serial data stream generated by delay element 24 is applied to the RESET input of flip-flop 26. Thus, manipulation of the analog voltage levels of the RE ADJUST and FE ADJUST signals constitutes fine adjustment of the timing of rising and falling edges of the timing signal presented at the output of flip-flop 26.

In the presently disclosed embodiment of the invention, a desired timing signal must first be defined in terms of the desired timing of rising and falling edges therein. Those of ordinary skill in the art having the benefit of the present disclosure will readily appreciate how this timing is then translated into the digital data to be stored in memory device 14. Storage of this digital data constitutes a coarse definition of the desired timing signal. As noted above, fine adjustment is accomplished through manipulation of the RE ADJUST and FE ADJUST programming voltages.

Once the desired data is stored in memory 14 and the RE ADJUST and FE ADJUST signals are set to desired levels, timing signal generator 10 is prepared for operation to generate the predefined timing signal, which is presented at the output of flip-flop 26. Operation commences with controller 12 functioning to access a memory location in memory 14, thereby causing a binary data word to be presented on data output lines 16. Operation of controller 12 and memory 14 is purely convention in nature and merits no particular description for the purposes of the present disclosure. The digital data on data lines 16 is then serialized by operation of serializer 18, which is likewise conventional and well understood by those of ordinary skill in the art.

As an implementation detail, it is to be noted that certain components of system 10 in accordance with the presently disclosed embodiment of the invention may preferably be of the well-known emitter-coupled logic (ECL) type. ECL circuitry is known to have desirable characteristics insofar as operational speed is concerned, making ECL particularly suitable for serializer 18, programmable delays 22 and 24, and even flip-flop 26. On the other hand, memory device 14 may be implemented using conventional complementary metal-oxide semiconductor (CMOS) or transistor-transistor logic (TTL) circuitry.

As is well known, binary values (digital ones and zeros) are represented differently in ECL circuitry and CMOS or TTL circuitry. In particular, the voltage levels representing binary values will differ as between ECL circuitry and CMOS or TTL circuitry. Accordingly, those of ordinary skill in the art will appreciate that, depending on the particular implementation, signal generator 10 in accordance with the presently disclosed embodiment of the invention may require one or more conversion circuits for converting between two logic types. For example, if memory 14 is implemented in CMOS but serializer 18 is implemented in ECL, voltage level conversion circuits may need to be interposed between those two components. In the interest of clarity of the disclosure, such level converters are not shown in the Figures. It is believed that the potential need for voltage converters in signal generator 10 would be easily recognized and readily achieved as a matter of routine engineering to those of ordinary skill in the art.

Figure 2:
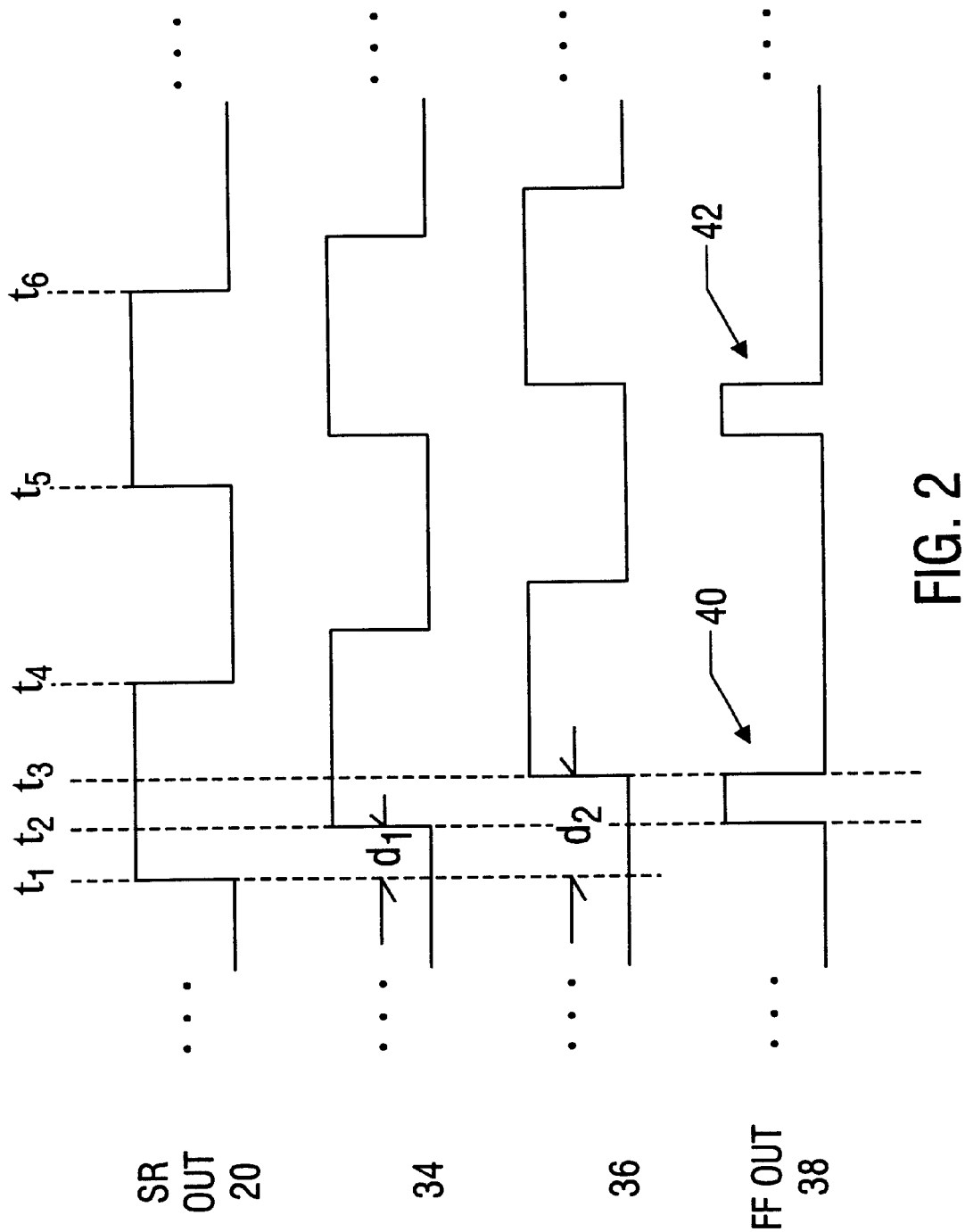
FIG. 2 is a timing diagram illustrating interrelationships between electrical signals present in the timing signal generator of FIG. 1.

For the example of FIG. 2, it is assumed that the first bits in the serial data output stream SR OUT 20 from serializer 18 are alternating ones and zeros, i.e., <1 0 1 0 1 0>. In the presently disclosed embodiment, serializer 18 receives a clock signal CLK2 having a frequency on the order of 500 MHz or so, such that one bit is output from serializer 18 every two nanoseconds. Referring to FIG. 2, the first bit (a binary one) is reflected in the positive (high) value of SR OUT signal 20 occurring between times $t_1$ and $t_4$. The second bit (a binary zero) is reflected in the low value of SR OUT signal 20 occurring between times $t_4$ and $t_5$. Finally, the third bit (a binary one) is reflected in the positive value of SR OUT 20 occurring between times $t_5$ and $t_6$. If serializer 18 is operating at a frequency of 500 MHz, the interval between times $t_1$ and $t_4$ is two nanoseconds, as is the interval between times $t_4$ and $t_5$ and the interval between times $t_5$ and $t_6$.

For the purposes of the example of FIG. 2, it will be assumed that the analog voltage RE ADJUST applied to the delay input of delay element 22 is set to a level so as to cause delay element 22 to introduce a 500 picosecond delay into propagation of the signal applied to its input. This is represented in FIG. 2 as the interval $d_1$ between times $t_1$ and $t_2$. Thus, the rising edge in the signal SR OUT 20 at time $t_1$ is delayed by the interval $d_1$ before appearing in the waveform 34 representing the output of delay element 22.

Similarly, it will be assumed that the analog voltage FE ADJUST applied to the delay input of delay element 24 is set to a level so as to cause delay element 24 to introduce a one nanosecond delay into the propagation of signals applied to its input. This is represented in FIG. 2 as the interval $d_2$ between times $t_1$ and $t_3$. Thus, the rising edge in the signal SR OUT 20 at time $t_1$ is delayed by the interval $d_2$ before appearing in the waveform 36 representing the output of delay element 24.

As noted above, output 34 from delay element 22 is applied to the set input (S) of flip-flop 26. Thus, upon the rising edge in output 34 at time $t_2$, flip-flop 26 is set, such that its output FF OUT 38 is asserted at time $t_2$. Likewise, since the output 36 from delay element 24 is applied to the reset input (R) of flip-flop 26, the output FF OUT 38 of flip-flop 26 is deasserted upon the rising edge of signal 36 at time $t_3$. The result is a 500 picosecond pulse designated with reference numeral 40 in the FF OUT 38 output from flip-flop 26. From FIG. 2, it is apparent that the operation of edge timing generator 10 between times $t_1$ and $t_4$ is repeated between times $t_5$ and $t_6$ to generate another 500 picosecond pulse designated with reference numeral 42.

From the foregoing example, those of ordinary skill in the art will appreciate how, through manipulation of the analog voltages RE ADJUST and FE ADJUST applied to the respective delay inputs of delay elements 22 and 24, the timing of rising and falling edges of the FF OUT waveform 38 can be very precisely controlled. Moreover, it is apparent that the rising and falling edges of pulses in the FF OUT waveform 38 are adjustable independently of one another.

Although the example described above with reference to FIG. 2 involves generation of a periodic (i.e., repeating) waveform, those of ordinary skill in the art will appreciate that the present invention is by no means limited to generation of periodic timing signals. Indeed, timing signals of virtually unlimited character can be produced, as determined by the data stored in memory 14 to coarsely define the timing of the signal to be produced.

Figure 3:
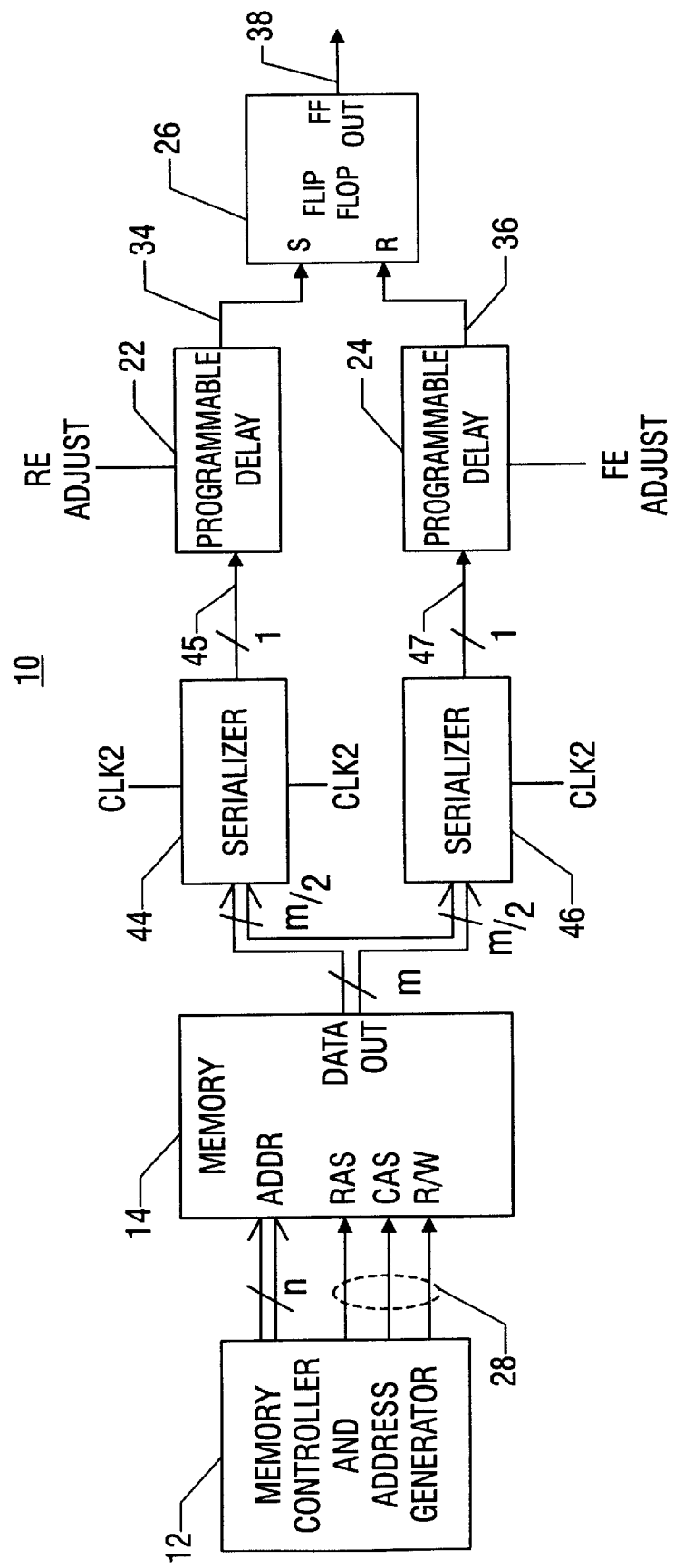
FIG. 3 is a block diagram of an edge-programmable timing signal generator in accordance with an alternative embodiment of the invention.

Turning now to FIG. 3, there is shown an edge-programmable signal timing generator 10' in accordance with an alternative embodiment of the invention. It is to be understood that those elements of generator 10' in FIG. 3 which are substantially identical to elements of generator 10 from FIG. 1 retain identical reference numerals in both Figures. Further, and as noted above with reference to FIG. 1, it is to be understood that, depending upon the type(s) of circuitry used to implement the various components in signal generator 10'(e.g., CMOS, TTL, ECL), logic level converting circuitry may be required. As in FIG. 1, such logic converting circuitry is not shown in FIG. 3 for the sake of clarity, it being understood that those of ordinary skill in the art would readily appreciate the potential need for such circuitry as a matter of routine engineering.

Generator 10' in FIG. 3 differs from that of FIG. 10 primarily in its use of two separate serializers 44 and 46 in place of single serializer 18 in the embodiment of FIG. 1. As shown in FIG. 3, it is assumed that memory 14 is m bits wide, i.e., that m bits are read during each memory access cycle. In the embodiment of FIG. 3, one-half of the bits in each memory word (i.e., m/2 bits) is supplied to serializer 44, and the other half is supplied to serializer 46. Thus, if memory 14 is a ×16 part, eight bits at a time are supplied to serializer 44 and eight bits at a time are supplied to serializer 46.

A significant advantage to the embodiment of FIG. 3 relates to the speed with which the various components must operate to achieve the desired resolution in the output of the circuit 10' as a whole. By employing two serializers 44 and 46, each one must operate only one-half as fast for a given memory access rate and a given width of memory 14.

Another significant advantage to the embodiment of FIG. 3 is that since different data is supplied to each serializer 44 and 46 during any given memory access (with one serializer receiving the high-order m/2 bits of the memory word and the other receiving the low-order m/2 bits), complex waveforms can be more easily generated at the output of flip-flop 26.

The configuration of FIG. 3 also overcomes a problem arising from the operational limitations of delay elements 22 and 24. Those of ordinary skill in the art will appreciate that typical delay elements are limited in the length of delay they can introduce to an input signal. The above-referenced Edge628 delay element, for example, can introduce no more than 6.6 nanoseconds of delay into a signal. As can be appreciated with reference to FIGS. 1 and 2, this limitation means that output pulses such as pulses 40 and 42 from flip-flop 26 can have a duration of no more than 6.6 nanoseconds. A 6.6 nanosecond pulse would result if the delay interval $d_1$ established by delay element 22 is programmed to zero while the delay interval $d_2$ established by delay element 24 is programmed to its maximum.

On the other hand, with the embodiment of FIG. 3, this limitation on the duration of pulses generated at the output of flip-flop 26 does not arise. This can perhaps be best appreciated with reference to the timing diagram of FIG. 4.

Figure 4:
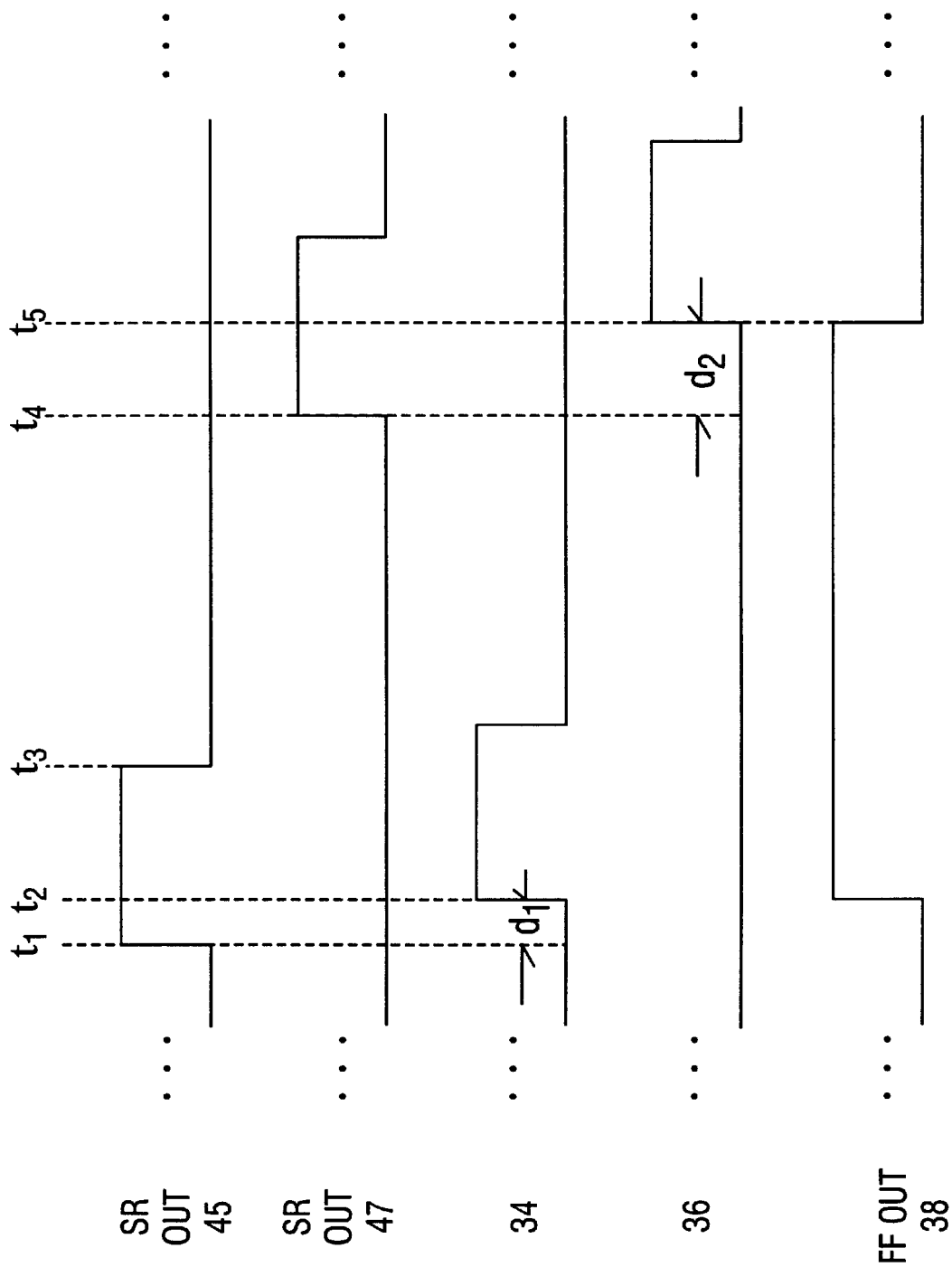
FIG. 4 is a timing diagram illustrating interrelationships between electrical signals present in the timing signal generator of FIG. 3.

For the purposes of the example of FIG. 4, it is assumed that memory 14 is a ×8 device, with eight bits being accessed during every read cycle (i.e., m=8, m/2=4). (Of course, this assumption is made only for the purposes of the present example; it should be apparent to those of ordinary skill in the art having the benefit of the present disclosure that memory devices of essentially any width can be employed for the purposes of practicing the present invention.) It will also be assumed for the purposes of FIG. 4 that delay elements 22 and 24 are programmed with the same RE ADJUST and FE ADJUST rising and falling edge adjust voltages as for the example of FIG. 2, such that delay element 22 introduces a 500 picosecond delay ($d_1$=500 picoseconds) and delay element 24 introduces a 1 nanosecond delay ($d_2$=1 nanosecond).

Operation of the embodiment of FIG. 3 begins just as with that of FIG. 1, involving the accessing of a desired location in memory 14 under control of controller 12. In this example, it will be assumed that the following eight bit word is read:

<1 0 0 0 0 0 0 1>

As noted above, four of these bits are applied to the input of serializer 44, and four are applied to the input of serializer 46. For the purposes of the present disclosure it will be assumed that the high-order four bits (<1 0 0 0>) are presented to serializer 44, and that serializer 44 is configured to output a serial data stream 1-0-0-0, with the binary one being first in the data stream and the zeros following. Likewise, it will be assumed that the low-order four bits (<0 0 0 1>) are applied to serializer 46, which is configured to output a serial data stream 0-0-0-1, with the binary one being last in the serial data stream. This is depicted in FIG. 4.

The leading binary one in the serial data stream output from serializer 44 is represented beginning at time $t_1$ in FIG. 4. This binary one leads to assertion of the output 34 of programmable delay 22 element 34 after the programmed delay interval $d_1$, beginning at time $t_2$. Assertion of output 34 causes flip-flop 26 to be set, causing FF OUT 38 to be asserted.

The first of the remaining three binary digits in the serial output from delay element 22 begins at time $t_3$. Output 34 from programmable delay element 22 remains low for the remainder of the present example reflecting the stream of zeros output from serializer 44.

On the other hand, the first three bits of the data stream output 47 from serializer 46 are all zeros, such that output 36 from delay element 24 remains at a logic low level. At time $t_4$, the fourth bit in the serial data stream output from serializer 46, a logic one, causes output 47 to go high. Following the programmed delay $d_2$ introduced by delay element 24, the output 36 of delay element 24 goes high. This, in turn, resets flip-flop 26, causing its output 38 to go low.

As can be seen from FIG. 4, therefore, providing two serializers simplifies the process of generating waveforms having pulses of essentially any length, with fine-tuning of the timing of rising and falling edges of such pulses being accomplished through manipulation of the programming voltages RE ADJUST and FE ADJUST. Those of ordinary skill in the art will readily appreciate how the programming voltages may be so manipulated, through the use, for example, of simple voltage divider circuits with adjustable resistances.

From the foregoing detailed description of specific embodiments of the invention, it should be apparent that a programmable timing signal generator has been disclosed which makes use of conventional delay elements to facilitate the fine adjustment of rising and falling edges of integrated circuit control signals. Although specific embodiments of the invention have been disclosed herein in some detail, this has been done solely for the purposes of illustrating various features and aspects of the present invention, and is not intended to be limiting with respect to the scope of the invention. It is contemplated that various substitutions, alterations and/or modifications, including but not limited to those design and implementation alternatives which may have been specifically discussed herein, may be made to the disclosed embodiments without departing from the spirit and scope of the invention as defined in the appended claims, which follow.

What is claimed is:

1. An edge programmable timing signal generator, comprising:

a memory subcircuit storing digital data coarsely defining desired rising and falling edges in a timing signal, said memory subcircuit adapted to output said digital data as a serial data stream at a serial output thereof;

first and second programmable delay elements each having an input coupled to said serial data source and each adapted to introduce a delay into said serial data stream and to present said delayed serial data stream at an output thereof;

a flip-flop circuit having a set input coupled to said output of said first programmable delay element to receive said delayed data stream presented thereon and having a reset input coupled to said output of said second programmable delay element to receive said delayed data stream presented thereon, and having an output for presenting a timing signal thereon;

wherein said flip-flop circuit is responsive to assertion of said first delayed data stream to assert said timing signal and responsive to assertion of said second delayed data stream to deassert said timing signal.

2. An edge programmable timing signal generator in accordance with claim 1, wherein said memory subcircuit comprises a memory device controlled to present a parallel data word to the input of a serializer, and wherein said serializer is adapted to serialize said parallel data word to generate said serial data stream.

3. An edge programmable timing signal generator in accordance with claim 1, wherein said first and second programmable delay elements each have a programming input for receiving an analog voltage programming signal thereon, and wherein the length of said delay introduced by each programmable delay element is proportional to the level of said respective analog programming signal applied to said programming input.

4. An edge programmable timing signal generator in accordance with claim 2, wherein said serializer comprises a shift register.

5. A method of generating a timing signal for a semiconductor device, comprising:

(a) storing a plurality of data bits coarsely defining desired rising and falling edges of a control signal;

(b) serializing said data bits to generate a serial data stream;

(c) applying said serial data stream signal to inputs of first and second programmable delay elements each adapted to introduce a delay into said serial data stream to produce respective first and second delayed serial data streams;

(d) applying said first delayed serial data stream to a SET input of a flip-flop circuit;

(e) applying said second delayed serial data stream to a RESET input of said flip-flop circuit;

such that said timing signal is presented on an output of said flip-flop circuit.

6. A method in accordance with claim 5, wherein said step (b) of serializing said data bits comprises:

(f) accessing a memory device to read said plurality of data bits;

(g) serializing said plurality of data bits to generate said serial data stream.

7. A method in accordance with claim 5, wherein said first and second delay elements are adapted to receive first and second programming voltages, respectively, for determining the respective lengths of delays introduced into said serial data stream.

* * * * *